United States Patent
Shen et al.

(10) Patent No.: US 11,056,556 B2
(45) Date of Patent: Jul. 6, 2021

(54) METAL-INSULATOR-METAL CAPACITIVE STRUCTURE AND METHODS OF FABRICATING THEREOF

(71) Applicant: Taiwan Semiconductor Manufacturing Co., Ltd., Hsinchu (TW)

(72) Inventors: Hsiang-Ku Shen, Hsinchu (TW); Ming-Hong Kao, Hsinchu (TW); Hui-Chi Chen, Hsinchu County (TW); Dian-Hau Chen, Hsinchu (TW); Yen-Ming Chen, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/439,385

(22) Filed: Jun. 12, 2019

(65) Prior Publication Data
US 2020/0105863 A1    Apr. 2, 2020

Related U.S. Application Data

(60) Provisional application No. 62/738,478, filed on Sep. 28, 2018.

(51) Int. Cl.
*H01L 49/02*    (2006.01)
(52) U.S. Cl.
CPC .................................. *H01L 28/60* (2013.01)

(58) Field of Classification Search
CPC . H01L 28/60; H01L 23/5223; H01L 23/5222; H01L 23/5226; H01L 28/40
See application file for complete search history.

(56) References Cited

U.S. PATENT DOCUMENTS

| | | | |
|---|---|---|---|
| 6,046,467 A | 4/2000 | Arita et al. | |
| 6,430,028 B1* | 8/2002 | Kar-Roy | H01L 28/40 257/E21.008 |
| 6,849,387 B2 | 2/2005 | Chiang et al. | |
| 7,915,134 B2* | 3/2011 | Chinthakindi | H01L 28/40 438/394 |
| 9,219,110 B2* | 12/2015 | Wang | H01L 23/585 |
| 9,391,016 B2* | 7/2016 | Shen | H01L 28/60 |
| 9,685,433 B2 | 6/2017 | Li et al. | |
| 9,761,655 B1* | 9/2017 | Ando | H01L 21/76883 |
| 10,211,147 B2* | 2/2019 | Zhang | H01L 21/31144 |
| 10,483,344 B1* | 11/2019 | Rubin | H01L 28/40 |
| 10,497,519 B1* | 12/2019 | Yang | H01G 4/018 |
| 10,672,980 B2* | 6/2020 | Ando | H01L 45/1253 |
| 2009/0200638 A1* | 8/2009 | Smith | H01L 21/76816 257/532 |

(Continued)

*Primary Examiner* — Nicholas J Tobergte
(74) *Attorney, Agent, or Firm* — Haynes and Boone, LLP

(57) ABSTRACT

A method of fabricating a metal-insulator-metal (MIM) capacitor structure includes forming a bottom electrode, forming a first oxide layer adjacent the bottom electrode, and depositing a first high-k dielectric layer over the bottom electrode and the first oxide layer. A middle electrode is then formed over the first high-k dielectric layer and a second oxide layer is formed adjacent the middle electrode. A second high-k dielectric layer may be deposited over the middle electrode and the second oxide layer and a top electrode over the second high-k dielectric layer.

20 Claims, 8 Drawing Sheets

(56) References Cited

U.S. PATENT DOCUMENTS

| | | | |
|---|---|---|---|
| 2013/0270675 A1* | 10/2013 | Childs | H01L 23/5226 257/532 |
| 2014/0159200 A1* | 6/2014 | Loke | H01L 23/5223 257/532 |
| 2014/0291805 A1* | 10/2014 | Hong | H01L 23/5223 257/532 |
| 2019/0305076 A1* | 10/2019 | Ando | H01L 21/76831 |
| 2020/0035780 A1* | 1/2020 | Huang | H01G 4/012 |

* cited by examiner

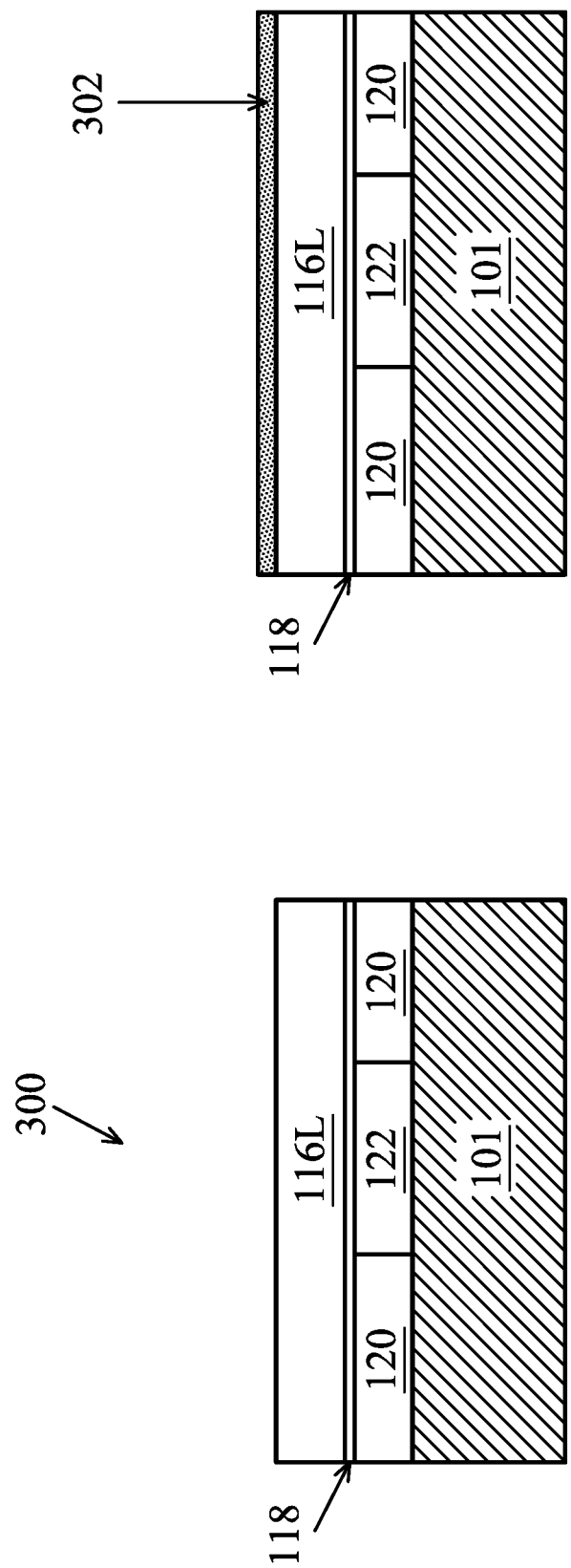

METAL-INSULATOR-METAL CAPACITIVE STRUCTURE AND METHODS OF FABRICATING THEREOF

CROSS-REFERENCE TO RELATED APPLICATION

This application claims the benefit of U.S. Provisional Application No. 62/738,478, filed Sep. 28, 2018, hereby incorporated by reference in its entirety.

BACKGROUND

The semiconductor integrated circuit industry has experienced rapid growth in the past several decades. Technological advances in semiconductor materials and design have produced increasingly smaller and more complex circuits. These material and design advances have been made possible as the technologies related to processing and manufacturing have also undergone technical advances. In the course of semiconductor evolution, the number of interconnected devices per unit of area has increased as the size of the smallest component that can be reliably created has decreased.

Many of the technological advances in semiconductors have occurred in the field of memory devices, and some of these involve capacitive structures. Such capacitive structures include, for example, metal-oxide-semiconductor (MOS) capacitors, p-n junction capacitors and metal-insulator-metal (MIM) capacitors. In some applications, MIM capacitors can provide certain advantages over MOS and p-n junction capacitors because the frequency characteristics of MOS and p-n junction capacitors may be restricted as a result of depletion layers that form in the semiconductor electrodes. A MIM capacitor can exhibit improved frequency and temperature characteristics. Furthermore, MIM capacitors are formed in or over the metal interconnect layers, thereby reducing CMOS transistor process integration interactions or complications.

However, in order to fabricate a MIM capacitor meeting the desired high-density there can be produced weak points in the structure. These weak points can cause breakdown or damage of the capacitor during stress of the capacitor or in the process of making or using the device. Thus, an improved structure and fabrication method of a MIM capacitor may be desired.

BRIEF DESCRIPTION OF THE DRAWINGS

Aspects of the present disclosure are best understood from the following detailed description when read with the accompanying figures. It is emphasized that, in accordance with the standard practice in the industry, various features of the figures are not drawn to scale. In fact, the dimensions of the various features may be arbitrarily increased or reduced for clarity of discussion.

FIGS. 3A, 3B, 3C, 3D, 3E, 3F, 3G, 3H, 3I, 3J, 3K, and 3L depict cross-sections of a metal-insulator-metal (MIM) capacitor fabricated using an embodiment of the method of FIG. 2 according to some aspects of the present disclosure.

Figure 1:
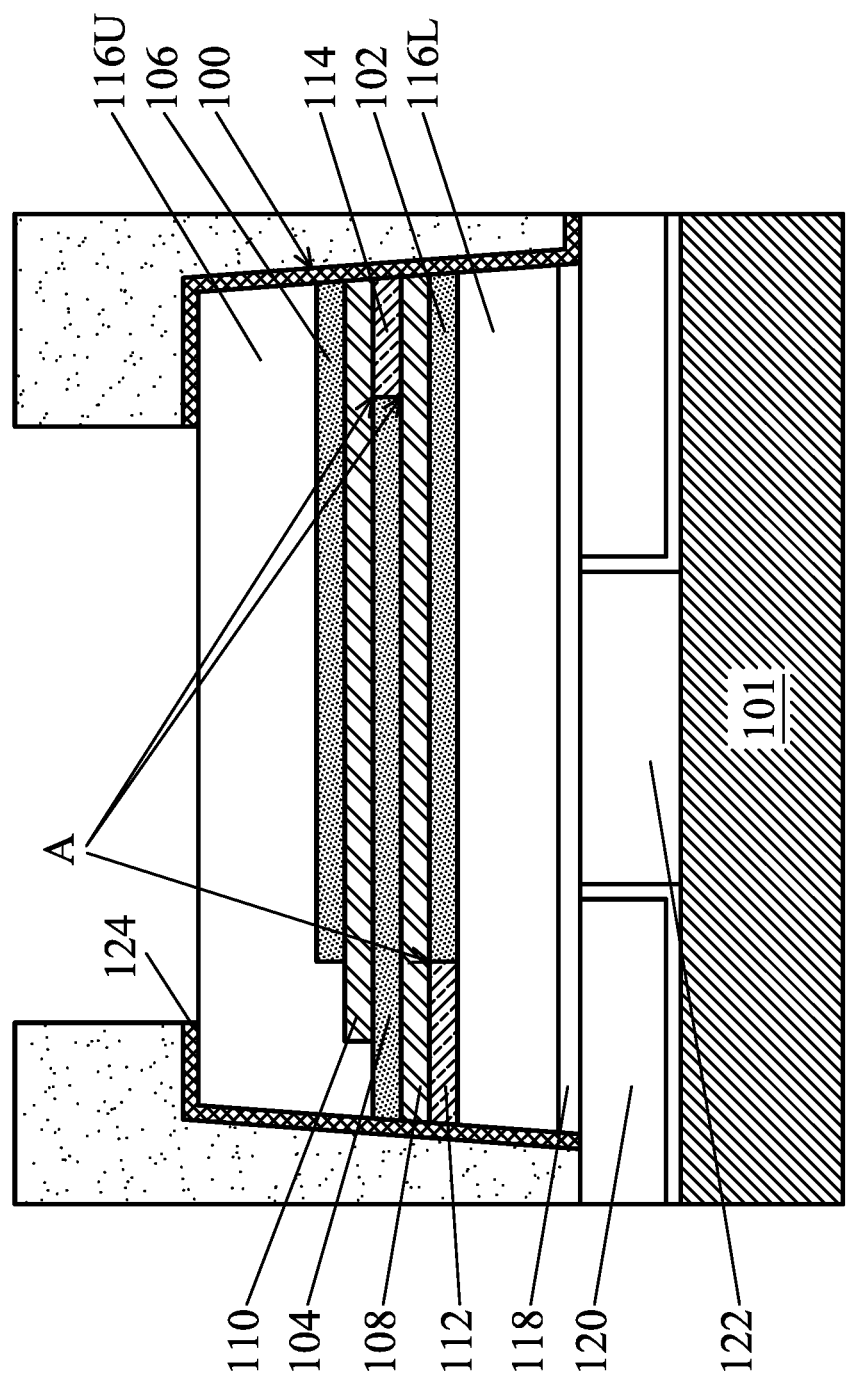
FIG. 1 depicts a cross-section of an embodiment of a metal-insulator-metal (MIM) capacitor according to aspects of the present disclosure.

The various features disclosed in the drawings briefly described above will become more apparent to one of skill in the art upon reading the detailed description below. Where features depicted in the various figures are common between two or more figures, the same identifying numerals have been used for clarity of description.

DETAILED DESCRIPTION

It is to be understood that the following disclosure provides many different embodiments and examples for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features in the figures may be arbitrarily drawn in different scales for the sake of simplicity and clarity.

A vertically stacked MIM capacitor 100 is shown in FIG. 1. MIM capacitor 100 includes electrodes or plates 102, 104, and 106 and interposing dielectric or insulating layers 108 and 110 therebetween. The electrode 102 is a bottom electrode of the MIM capacitor 100. The electrode 104 is a middle electrode of the MIM capacitor 100. The electrode 106 is a top electrode of the MIM capacitor 100. Dielectric layers 108 and 110 interpose the electrodes 102 and 104 and 104 and 106 respectively. In other embodiments of the MIM capacitor 100, other number of electrodes may be possible including those configurations with two or more plates. In an embodiment, the electrode 102 and the electrode 106 are maintained at a first potential (in operation) and electrode 104 is provided at a second potential (in operation), the second potential being different than the first. Thus, capacitance is formed between each of the electrode 102 and the electrode 104 (e.g., at the region of their overlap), and between the electrode 106 and electrode 104 (e.g., at the region of their overlap).

The MIM capacitor 100 is formed over a substrate 101. In many embodiments, the substrate 101 includes one or more active devices (not shown) formed on the substrate. Examples of such active devices include P-channel field effect transistors (PFETs), N-channel FETs (NFETs), metal-oxide semiconductor field effect transistors (MOSFETs), complementary metal-oxide semiconductor (CMOS) transistors, FinFETs, high voltage transistors, high frequency transistors, bipolar junction transistors, other suitable devices, and/or combinations thereof.

The substrate 101 includes an elementary semiconductor (e.g., silicon or germanium) and/or a compound semiconductor (e.g., silicon germanium, silicon carbide, gallium arsenic, indium arsenide, gallium nitride, and indium phosphide). Other exemplary substrate materials include alloy semiconductors, such as silicon germanium carbide, gallium arsenic phosphide, and gallium indium phosphide. In some embodiments, the substrate 101 has one or more layers defined within it, such as an epitaxial layer. For example, in one such embodiment, the substrate 101 includes an epitaxial layer overlying a bulk semiconductor. Other layered substrates include semiconductor-on-insulator (SOI) substrates. In one such SOI substrate, the substrate 101 includes a buried oxide (BOX) layer formed by a process such as separation by implanted oxygen (SIMOX). In various embodiments, the substrate 101 may take the form of a planar substrate, a fin, a nanowire, and/or other forms known to one of skill in the art.

The substrate 101 may include one or more doped regions. For example, a region of the substrate 101 may be doped with a p-type dopant. Suitable p-type dopants include boron, gallium, indium, other suitable p-type dopants, and/or combinations thereof. The substrate may also include one or more regions doped with an n-type dopant such as phosphorus, arsenic, other suitable n-type dopants, and/or combinations thereof. Doping may be implemented using a process such as ion implantation or diffusion in various steps and techniques.

The substrate 101 may also include an active device such as a PFET, an NFET, a MOSFET, a CMOS transistor, a FinFET, a high voltage transistor, a high frequency transistor, a bipolar junction transistor, and/or other suitable device is formed in the active device region. In an exemplary embodiment, the active device includes source/drain regions and a gate stack. The source/drain regions may be formed by implanting the substrate 101 with p-type dopants (P+), such as boron or $BF_2$, and/or n-type dopants (N+), such as phosphorus or arsenic. In some embodiments, the source/drain regions are formed by processes including halo implantation, etching, ion-implantation, epitaxy, and/or annealing steps.

Exemplary materials of the MIM capacitor 100 are now discussed in further detail. Dielectric layers 108 and 110 inhibit current flow between the adjacent electrodes 102, 104, or 106. In some embodiments, the materials of the dielectric layers 108 and 110 may be high-k dielectrics. Exemplary high-k dielectric materials include Al2O3, ZrO2, Ta2O5, HfO2, La2O3, TiO2, SiO2, or a combination hereof. The thickness of the dielectric layers 108 and 110 may be determined as desired to tune the capacitance of the MIM capacitor 100. Exemplary thicknesses for the dielectric layers 108 and/or 110 include approximately 20 Angstroms to approximately 100 Angstroms. In an embodiment, the dielectric layers 108 and 110 are approximately 60 Angstroms. A variety of suitable processes including chemical vapor depositions (CVD), low-pressure CVD (LPCVD), plasma-enhanced CVD (PECVD), and atomic layer deposition (ALD) may be used to form the dielectric layers 108 and/or 110.

The electrodes 102, 104, and 106 may be a same conductive material; or alternatively, may be different conductive materials. In an embodiment, the electrodes 102, 104 and/or 106 include titanium nitride (TiN). Other exemplary compositions for the electrodes 102, 104, and/or 106 include Si, polysilicon, Ta, Ti, TaN, W, Cu, Al, AlCu, Ir, Ru, Pt, combinations thereof, and/or other suitable conductive materials. The thickness of the electrodes 102, 104, and/or 106 may be determined to ensure adequate conductive properties of the plate(s). Exemplary thicknesses include between approximately 400 Angstroms and approximately 800 Angstroms. In a further embodiment, the thickness of each electrode is between approximately 400 and approximately 600 Angstroms. While a cross-sectional view is shown in FIG. 1, the electrodes 102, 104, and/or 106 may be of various shapes in a plan or top view. It is noted that the overlap between the electrodes 102, 104, and 106 determine the capacitor performance. Thus, the capacitance of the MIM capacitor 100 can be tuned by adjusting the size of the portion of the bottom electrode 102 directly underlying the middle electrode 104, and so forth.

The electrodes 102, 104, and/or 106 may be formed over the substrate 101 by a suitable process (e.g., sputtering, e-beam evaporation). Conductive material may be suitably deposited and may be patterned such as include conducting a photolithography process, a maskless lithography process, or a variety of processes suitable for transferring a pattern to the respective electrode 102, 104, or 106. This may be done by any number of combinations of material removal processes or it may be accomplished by a single material removal process. Each electrode 102, 104, or 106 may be formed in a variety of shapes such as for example a circle, a curvilinear shape, a rectangle, a line, a polygon including with rounded corners, and/or other suitable shapes.

Additionally, insulator layers 112 and 114 are formed in the MIM capacitor 100. The insulator layer 112 is coplanar with the first electrode 102. According to embodiments, substantially coplanar layers may be defined as layers that are laterally aligned at at least one portion of the layers. In an embodiment, a top surface of the insulator layer 112 is substantially coplanar with a top surface of the first electrode 102. According embodiments, a substantially coplanar surface may be defined as a surface that is shared by at least a first surface and a second surface, wherein the first surface and the second surface are laterally aligned (i.e., the first surface and the second surface are not out of plane with respect to each other) or the first surface and the second surface are out of plane with a tolerable value (e.g., 5%). The insulator layer 114 is coplanar with the middle electrode 104. In an embodiment, a top surface of the insulator layer 114 is approximately (e.g., within fabrication process tolerances) coplanar with a top surface of the middle electrode 104. The insulator layers 112 and 114 may be a same composition as each other. The insulator layers 112 and 114 may be of a different composition than each of the dielectric layers 108 and 110. In an alternative embodiment, the insulator layers 112 and 114 may be a same composition as one of more of dielectric layers 108 and 110, for example, an oxide (e.g., $SiO_2$). In an embodiment, the insulator layers 112 and/or 114 are silicon oxide. In an embodiment, the insulator layers 112 and/or 114 are silicon nitride. The insulator layers 112 and 114 may have a same composition as one another, or alternatively, differ in compositions.

In an embodiment, the insulator layer 112 has a substantially similar thickness as the electrode 102. In an embodiment, the insulator layer 112 is between approximately 40 nm and approximately 80 nm in thickness. In an embodiment, the insulator layer 114 has a substantially similar thickness as the electrode 104. In an embodiment, the insulator layer 114 is between approximately 40 nm and approximately 60 nm in thickness.

Under the bottom electrode layer 102 is an insulator layer 116L. In an embodiment, the insulator layer 116L is silicon oxide. The thickness of the insulator layer 116L may between approximately 2000 Angstroms and 3000 Angstroms. The oxide composition and thickness may be determined such that sufficient isolation is provided to MIM capacitor 100. In an embodiment, the insulator layer 116L has a thickness of approximately 2500 Angstroms. A layer 118 may underlie the insulator layer 116L. In an embodiment, the layer 118 is a silicon nitride. In an embodiment, the layer 118 may be approximately 750 Angstroms, though other thicknesses are possible including, for example, between approximately 550 Angstroms and approximately 950 Angstroms. The layer 118 may provide an etch stop layer for subsequent processes such as, etching of contact holes.

Above the top electrode layer 106 is an insulator layer 116U, such as an oxide (e.g., silicon oxide). The insulator layer 116U may be the same composition as the insulator layer 116L. In an embodiment, the thickness of the insulator layer 116U may be greater than 650 nm. The thickness of the insulator layer 116U may between approximately 6000 Angstroms and approximately 7000 Angstroms. The oxide composition and thickness may be determined such that sufficient isolation is provided for the capacitor 100. In an embodiment, the insulator layer 116U has a thickness of approximately 6500 Angstroms. In another embodiment, the insulator layer 116U has a thickness of approximately 670 nanometers.

A barrier layer 124 surrounds the MIM capacitor 100. The barrier layer may include a plurality of layers such as Ti and TiN. Other suitable compositions are also possible. Outside of the barrier layer is typically insulating material that provides electrical insulation between other devices (e.g., other MIM capacitors) formed on the substrate. Various contact features may extend to the MIM capacitor 100. In an embodiment, the contact feature (e.g., a via) extends to interconnect a plate of the MIM capacitor 100 and the metal layer 120, discussed below.

The MIM capacitor 100 is disposed over a metal layer 120. The metal layer 120 may be a top (e.g., uppermost) metal layer of a multi-layer interconnect (MLI) structure. The MLI structure may include a plurality of metal, or otherwise conductive, lines and vias. In an embodiment, the metal layer 120 may include copper. Other exemplary compositions include aluminum, polysilicon, alloys including those of aluminum or copper, and/or other suitable materials. The MLI structure may be formed over and used to interconnect active devices such as transistors formed on the substrate 101. In an embodiment, on the substrate 101 includes a gate structure interposing source and drain features forming a transistor. The transistor(s) may be a fin-type field effect transistor (FinFET). The MIM capacitor 100 may be interconnected with one or more transistors formed on the substrate 101. In some embodiments, the MIM capacitor 100 is part a memory device, for example, the MIM capacitor 100 may be a memory element of a resistive random-access memory (RRAM) cell and/or of a suitable type of various non-volatile computer memory cells.

The top metal layer 120 of the MLI structure may be a metal line providing horizontal routing interconnecting one or more active or passive features disposed on the substrate. The top metal layer 120 may be interconnected to lower metal lines through a horizontally extending conductive via (not shown). The MLI structure also includes inter-metal dielectric (IMD) layers, including an IMD layer 122, which may be found around the metal layer 120. The IMD layer 122 may be a low-k dielectric material including a silicon oxide based low-k dielectric material. Compositions include silicon oxide, silicon nitride, silicon oxynitride, TEOS oxide, phosphosilicate glass (PSG), borophosphosilicate glass (BPSG), fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other suitable materials, and/or combinations thereof. Again, a barrier layer 124 may be formed with the metal layer 120, the barrier layer 124 may be substantially similar as discussed above with reference to the barrier layer 124 of the MIM capacitor 100.

As a result, in some such embodiments, these structures such as MIM capacitor 100 are formed as part of a back end of line (BEOL) process. In contrast, forming a gate structure is typically a front end of line (FEOL) process. In such embodiments, the MIM capacitor 100 is formed after FEOL processes have completed. As a further advantage, the density of the MIM capacitor may be increased without the spatial limitations of the MLI structure or the patterning of the active device such as transistors. In some embodiments, the density of the MIM capacitors 100 on the substrate 101 may be achievable for density of between approximately 73-90%. In some embodiments, the MIM capacitor 100 may be part of an array of capacitor devices such as a 1 by 20 array to a 250 by 250 array.

It is noted that in the MIM capacitor 100 there are points annotated "A" where the plate of the capacitor has a corner. It is noted that this "corner" is not limited to 90 degrees, but may be rounded. The "corner" is a termination point of the respective electrode of the MIM capacitor 100 (e.g., electrode 102, electrode 104). With respect to these points annotated "A", the termination of the plate of the capacitor, there is an interface on the respective electrode's lateral sidewall with a high-k dielectric material. However, at an upper and/or lower termination edge (e.g., a corner), the electrode interfaces insulator material 112 and 114 such as, an oxide material. Certain benefits may be provided in some embodiments with this configuration. Namely, the region "A" or corner of the electrode of the MIM capacitor may be a region that is more likely to experience stress and thus, in some embodiments, more likely to experience breakdown or damage by processes or stress in fabrication or operation. The region "A" in the embodiment of FIG. 1 provides for in some embodiments a mitigation of the stresses at the region "A" by the provision of the separate oxide material (e.g., 112, 114) in lieu of, for example, a high-k dielectric covering the sidewall and region "A". This oxide may have a lower dielectric constant. Additional coverage of the region "A" is also provided as the insulator material is separately deposited and planarized before depositing the high-k dielectric material. Thus, there is mitigated concern of, for example, conformal deposition of the high-k dielectric material providing step-coverage over the region "A".

Figure 2:
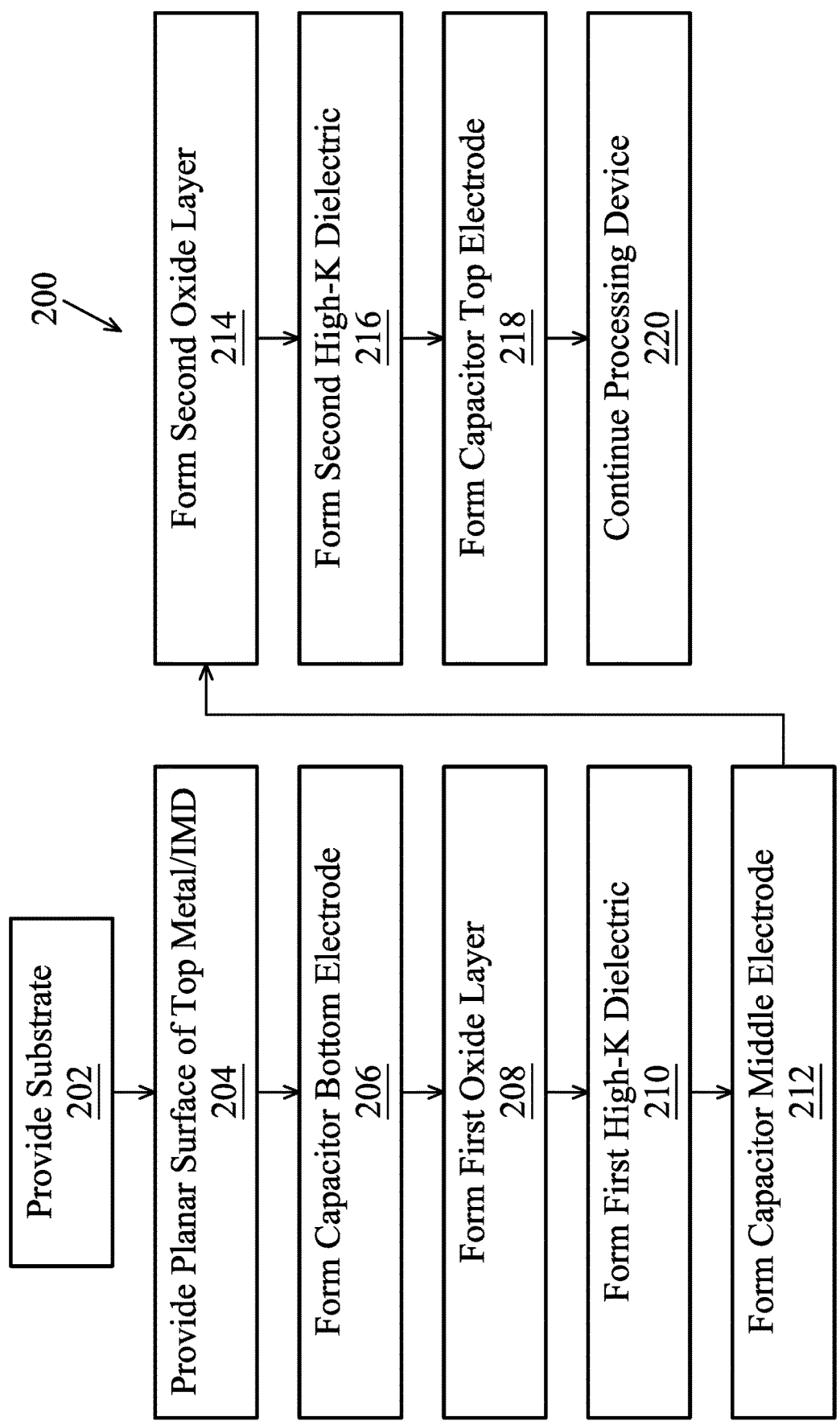
FIG. 2 depicts a flow a method of fabricating a metal-insulator-metal (MIM) capacitor according to aspects of the present disclosure.

FIG. 2 is a flowchart of a method 200 of fabricating a MIM capacitor constructed according to various aspects of the present disclosure. The method 200 is described with reference to FIG. 2 and in conjunction with FIGS. 3A, 3B, 3C, 3D, 3E, 3F, 3G, 3H, 3I, 3J, 3K and 3L and exemplary MIM capacitor 300. The MIM capacitor 300 may be substantially similar to the MIM capacitor 100 described above with reference to FIG. 1. In some embodiments, the MIM capacitor 100 is fabricated using the method 200 or aspects thereof.

In some embodiments, the MIM capacitor fabricated according to the disclosed method 200 may be a memory element of a resistive random-access memory (RRAM) cell and/or of a suitable type of various non-volatile computer memory cells. It is understood that additional steps can be provided before, during, and/or after the method 200, and some of the steps described can be replaced, eliminated, and/or moved around for additional embodiments of the method 200.

The method 200 begins at block 202 with providing a substrate. Referring to the example of FIG. 3A, a substrate 101 is provided. The substrate 101 may be substantially similar to as discussed above with reference to the MIM capacitor 100 of FIG. 1. The substrate 101 may include various features such as active transistors interconnected by a MLI structure. As illustrated in FIG. 3A, the substrate 101 includes a top metal layer 120 and an IMD layer 122, substantially similar to as discussed above with reference to the MIM capacitor 100 of FIG. 1.

The method 200 proceeds to block 204 where a surface of the substrate is prepared. The surface may be a planar surface. In an embodiment, the prepared surface is an insulating material such as a top surface of an insulating layer. Referring to the example of FIG. 3A, an insulator layer 116L, such as an oxide, is disposed over the substrate. An etch stop layer 118, such as silicon nitride, may underlie the insulator layer 116L. The layer 118 and the insulator layer 116L may be substantially similar to as discussed above in the MIM capacitor 100 of FIG. 1. In an embodiment, the insulator layer 116L is an oxide such as silicon oxide. The insulator layer 116L and/or the layer 118 may be formed by chemical vapor deposition (CVD) and/or other suitable methods. A chemical mechanical planarization (CMP) process may be performed to provide the surface of block 204 as a planar surface.

The method 200 continues at block 206 where a capacitor bottom plate or electrode is formed over the substrate. The capacitor bottom electrode may be fabricated by depositing a conformal layer of conductive material that is subsequently patterned to form the electrode. Referring to the example of FIG. 3B, a conductive layer 302 is disposed over the substrate 101. In an embodiment, the conductive layer 302 is TiN. Other conductive materials include Si, polysilicon, Ta, Ti, TaN, W, Cu, Al, AlCu, Ir, Ru, Pt, combinations thereof, and/or other suitable conductive materials.

Figure 3D:
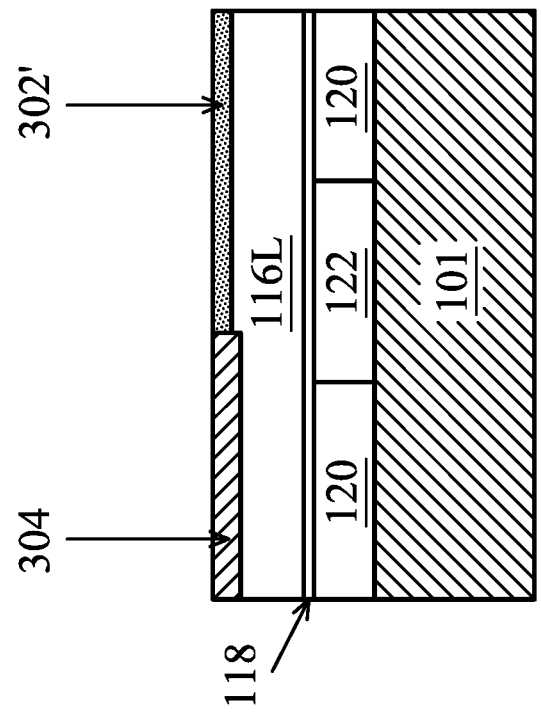
Figure 3C:
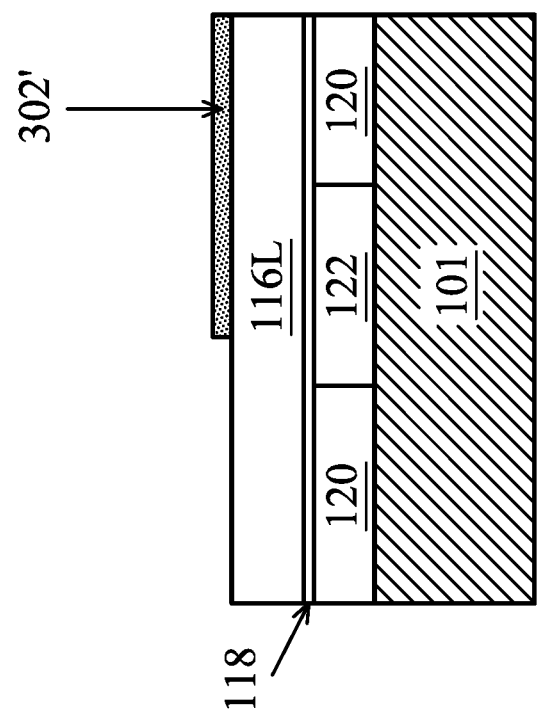
Figure 3F:
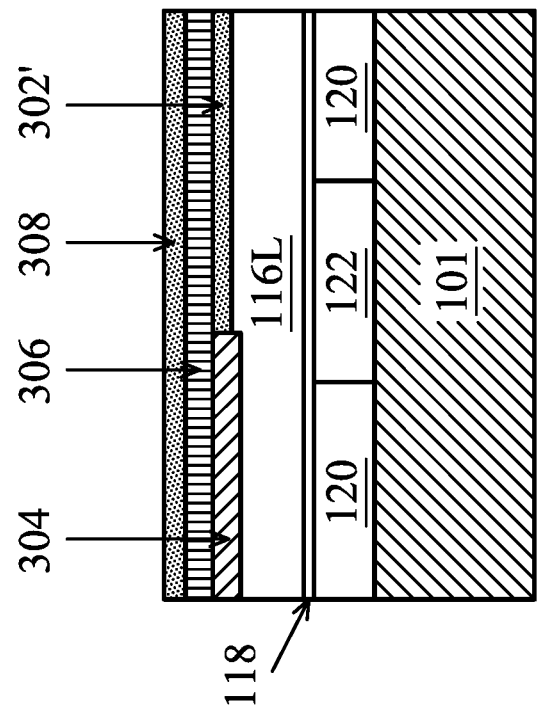
Figure 3E:
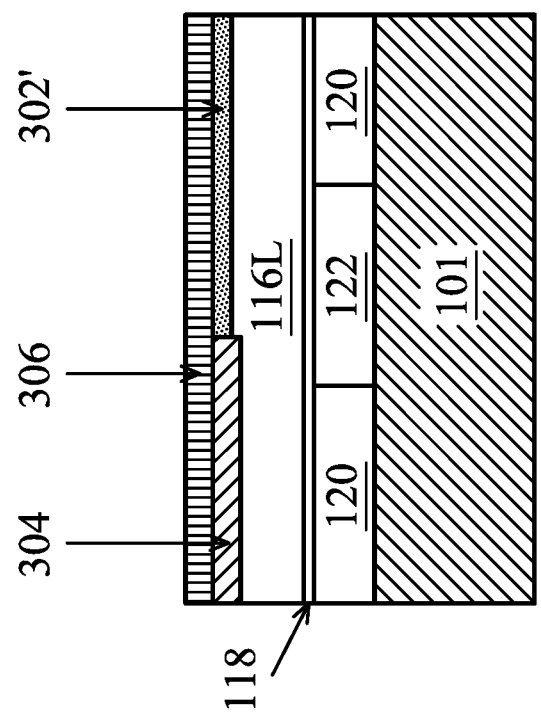
Figure 3H:
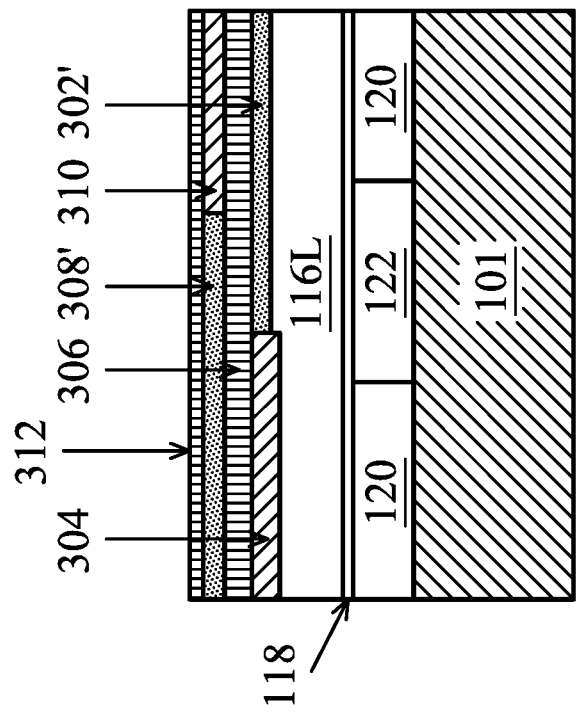

The conductive layer 302 may be then patterned to form the desired shape of the capacitor bottom electrode. The deposited conductive material may be patterned by conducting a photolithography process, a maskless lithography process, or a variety of processes suitable for transferring a pattern to the conductive layer 302. This may be done by any number of combinations of material removal processes or it may be accomplished by a single material removal process. Referring to the example of FIG. 3C, the conductive layer 302 has been patterned to form the electrode 302'. An opening is formed adjacent the electrode 302' exposing the underlying insulator layer 116L. It is noted that as illustrated in FIG. 3C, the opening exposes a top surface of the insulator layer 116L that is coplanar with the surface underlying the electrode 302'. In some embodiments, an etching of a portion of the insulating layer 116L may also occur during the patterning of the electrode 302'. Thus, the exposed top surface of the insulator layer 116L may be below the top surface of the insulator layer 116L under the electrode 302'. See FIG. 3D. The electrode 302' may be formed in a variety of shapes such as for example a circle, a curvilinear shape, a rectangle, a line, a polygon including with rounded corners, and/or other suitable shapes.

The method 200 then continues to block 208 where a first oxide layer is formed adjacent the first electrode of the capacitor. It is noted that while the layer is referred to as an "oxide layer," in some embodiments, another composition may be used such as silicon nitride. The first oxide layer is formed in the openings adjacent the bottom electrode discussed above in block 206. Referring to the example of FIG. 3D, the first oxide (or nitride) layer 304 is formed adjacent the electrode 302'. The first oxide layer 304 may be silicon oxide, silicon nitride, combinations thereof, and/or other suitable compositions. In an embodiment, the first oxide layer is formed by chemical vapor deposition (CVD). However, a variety of suitable processes including CVD, low-pressure CVD (LPCVD), plasma-enhanced CVD (PECVD), atomic layer deposition (ALD), thermal oxidation, combinations thereof, and/or other suitable processes may be used to form the first oxide layer 304.

In an embodiment, the insulating material may be formed to a thickness that is greater than that of the electrode 302' such that a top surface of the insulating material lies above the top surface of the electrode 302'. In an embodiment, a thickness of the insulating material deposited is approximately twice a thickness of the electrode 302'. A chemical mechanical planarization (CMP) process may then be formed that reduces the thickness of the deposited insulating material and provides a planar top surface. In an embodiment, the CMP process has an end point (e.g., a timed-endpoint) approximately on the top surface of the electrode 302'. For example, the CMP may stop approximately at a top surface of the electrode 302' (e.g., within fabrication processes tolerances such as 5% over etch of the electrode 302'). As illustrated in the example of FIG. 3D, a planar top surface including the electrode 302' and the first oxide layer 304 is formed. In an embodiment, the resultant thickness of layer 304 is approximately equal to that of the electrode 302'. In an embodiment, the resultant thickness of layer 304 is greater than that of the electrode 302'. For example, the insulating material of layer 304 may extend lower than the electrode 302'. In an embodiment, the thickness difference between layer 304 and electrode 302' may be controlled by controlling an over etch time or amount. In an embodiment, if the over etch amount is less, a subsequent planarization process can be reduced in the amount of removed material providing a more efficient process.

The method 200 then continues to block 210 where a first high-k dielectric layer is formed over the substrate. The first high-k dielectric layer may be deposited in as a conformal layer. Referring to the example of FIG. 3E, the first high-k dielectric layer 306 is deposited over the substrate 101. In an embodiment, the first high-k dielectric layer 306 is conformally deposited on a planar surface, without having to provide step-coverage (for example, over a sidewall or corner of the electrode 302'). The first high-k dielectric layer 306 interfaces the planar top surface including the electrode 302' and the first oxide layer 304. The first high-k dielectric layer 306 has a different composition that than the first oxide layer 304.

Exemplary high-k dielectric materials for the first high-k dielectric layer 306 include $Al_2O_3$, $ZrO_2$, $Ta_2O_5$, $HfO_2$, $La_2O_3$, $TiO_2$, $SiO_2$, or a combination hereof. The thickness of the first high-k dielectric layer 306 may be determined as desired tune the capacitance of the MIM capacitor 300. Exemplary thicknesses for the high-k dielectric layer may be between approximately 20 Angstroms to approximately 100 Angstroms. A variety of suitable processes including chemical vapor depositions (CVD), low-pressure CVD (LPCVD), plasma-enhanced CVD (PECVD), and atomic layer deposition (ALD) may be used to form the first high-k dielectric layer 306.

The method 200 continues at block 212 where a capacitor middle plate or electrode is formed over the substrate. The capacitor middle electrode may be fabricated by depositing a conformal layer of conductive material that is subsequently patterned to form the electrode. Referring to the example of FIG. 3F, a conductive layer 308 is disposed over the substrate 101. In an embodiment, the conductive layer 308 is TiN. Other conductive materials include Si, polysilicon, Ta, Ti, TaN, W, Cu, Al, AlCu, Ir, Ru, Pt, combinations thereof, and/or other suitable conductive materials. The conductive layer 308 may be the same composition as the conductive layer 302, or alternatively, a different composition may be provided.

The conductive layer 308 may be then patterned to form the desired shape of the capacitor middle electrode. The deposited conductive material may be patterned by conducting a photolithography process, a maskless lithography process, or a variety of processes suitable for transferring a pattern to the conductive layer 308 to form the electrode 308'. This may be done by any number of combinations of material removal processes or it may be accomplished by a single material removal process. The electrode 308' may be formed in a variety of shapes such as for example a circle, a curvilinear shape, a rectangle, a line, a polygon including with rounded corners, and/or other suitable shapes. Referring to the example of FIG. 3G, the conductive layer 308 (FIG. 3F) has been patterned to form the electrode 308'. In the patterning, an opening is formed adjacent the electrode 308' exposing the underlying first high-k dielectric layer 306.

The method 200 then continues to block 214 where a second oxide layer is formed adjacent the middle electrode of the capacitor. It is noted that while the layer is referred to as an "oxide layer," in some embodiments, another composition may be used such as silicon nitride. The second oxide layer is formed in the openings adjacent the middle electrode discussed above in block 212. Referring to the example of FIG. 3G, the second oxide (or nitride) 310 is formed adjacent the middle electrode 308'. The second oxide layer 310 may be silicon oxide, silicon nitride, combinations thereof, and/or other suitable compositions. In an embodiment, the second oxide layer 310 and the first oxide layer 304 may include a same composition. A variety of suitable processes including chemical vapor depositions (CVD), low-pressure CVD (LPCVD), plasma-enhanced CVD (PECVD), atomic layer deposition (ALD), thermal oxidation, and/or other suitable processes may be used to form the second oxide layer 310.

Figure 3G:
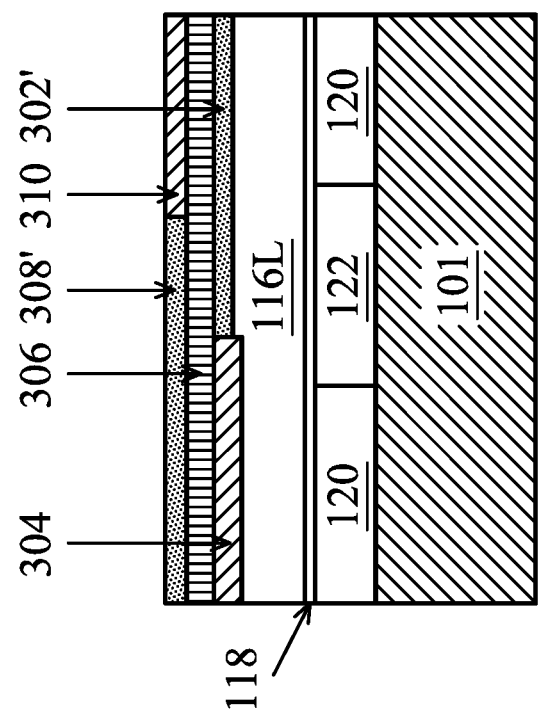
Figure 3J:
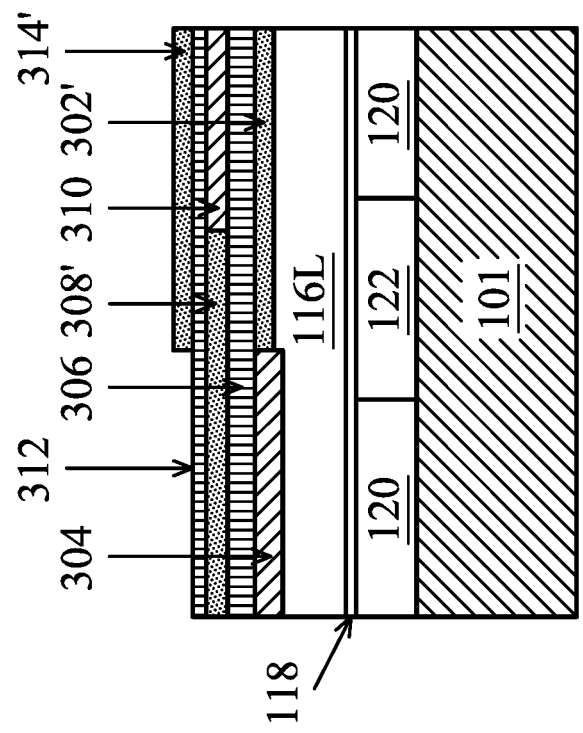
Figure 3I:
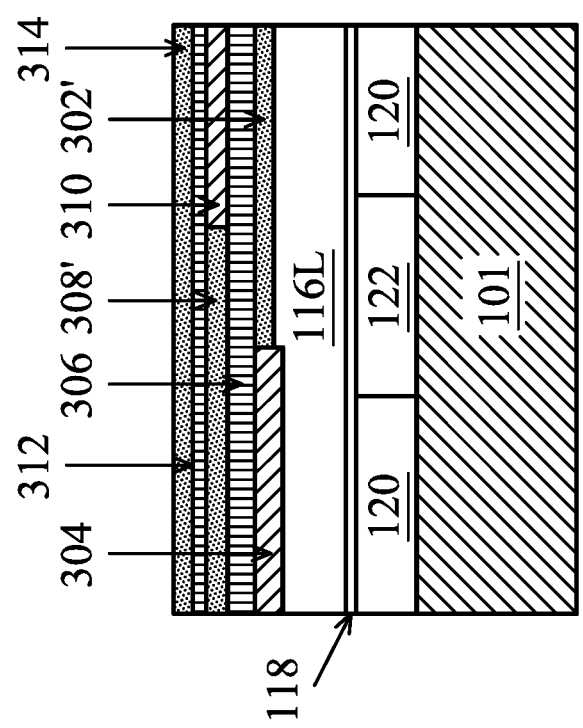

In an embodiment, the insulating material may be formed to a thickness that is greater than that of the electrode 308' such that a top surface of the insulating material lies above the top surface of the electrode 308'. A chemical mechanical planarization (CMP) process may then be formed that reduces the thickness of the deposited insulating material. In an embodiment, the CMP process has an end point (e.g., a timed-endpoint) on the top surface of the electrode 308'. As illustrated in the example of FIG. 3G, a planar top surface including the electrode 308' and the second oxide layer 310 is formed.

The method 200 then continues to block 216 where a second high-k dielectric layer is formed over the substrate. The second high-k dielectric layer may be deposited as a conformal layer. In an embodiment, the conformal layer is deposited on a planar surface provided by block 214. Referring to the example of FIG. 3H, a second high-k dielectric layer 312 is deposited over the substrate 101. The second high-k dielectric layer 312 interfaces the planar top surface including the electrode 308' and the second oxide layer 310. In an embodiment, the second high-k dielectric layer 312 has a different composition that than the second oxide layer 310. The second high-k dielectric layer 312 may have the same composition as the first high-k dielectric layer 306.

Exemplary high-k dielectric materials for the second high-k dielectric layer 312 include $Al_2O_3$, $ZrO_2$, $Ta_2O_5$, $HfO_2$, $La_2O_3$, $TiO_2$, $SiO_2$, or a combination hereof. The thickness of the second high-k dielectric layer 312 may be determined as desired tune the capacitance of the MIM capacitor 300. Exemplary thicknesses for the high-k dielectric layer may be between approximately 20 Angstroms to approximately 100 Angstroms. A variety of suitable processes including chemical vapor depositions (CVD), low-pressure CVD (LPCVD), plasma-enhanced CVD (PECVD), and atomic layer deposition (ALD) may be used to form the second high-k dielectric layer 312.

The method 200 continues at block 218 where a capacitor upper or top plate or electrode is formed over the substrate. The capacitor top electrode may be fabricated by depositing a conformal layer of conductive material that is subsequently patterned to form the electrode. Referring to the example of FIG. 3I, a conductive layer 314 is disposed over the substrate 101. In an embodiment, the conductive layer 314 is TiN. Other conductive materials include Si, polysilicon, Ta, Ti, TaN, W, Cu, Al, AlCu, Ir, Ru, Pt, combinations thereof, and/or other suitable conductive materials. The conductive layer 314 may be the same composition as the conductive layer 302 and/or 308, or alternatively, a different composition may be provided.

The conductive layer 314 may be then patterned to form the desired shape of the capacitor upper electrode. The deposited conductive material may be patterned by conducting a photolithography process, a maskless lithography process, or a variety of processes suitable for transferring a pattern to the conductive layer 314 to form the electrode 314'. This may be done by any number of combinations of material removal processes or it may be accomplished by a single material removal process. The electrode 314' may be formed in a variety of shapes such as for example a circle, a curvilinear shape, a rectangle, a line, a polygon including with rounded corners, and/or other suitable shapes. Referring to the example of FIG. 3J, the conductive layer 314 (FIG. 3I) has been patterned to form the electrode 314'. In the patterning, an opening is formed adjacent the electrode 314' exposing the underlying second high-k dielectric layer 312.

The method 200 then continues where the device including the capacitor 300 is further processed in block 220. For example, additional insulating layers may be formed and contacts to the capacitor 300 and/or other features formed on the substrate 101 may be formed.

Figures 3K, 3L:
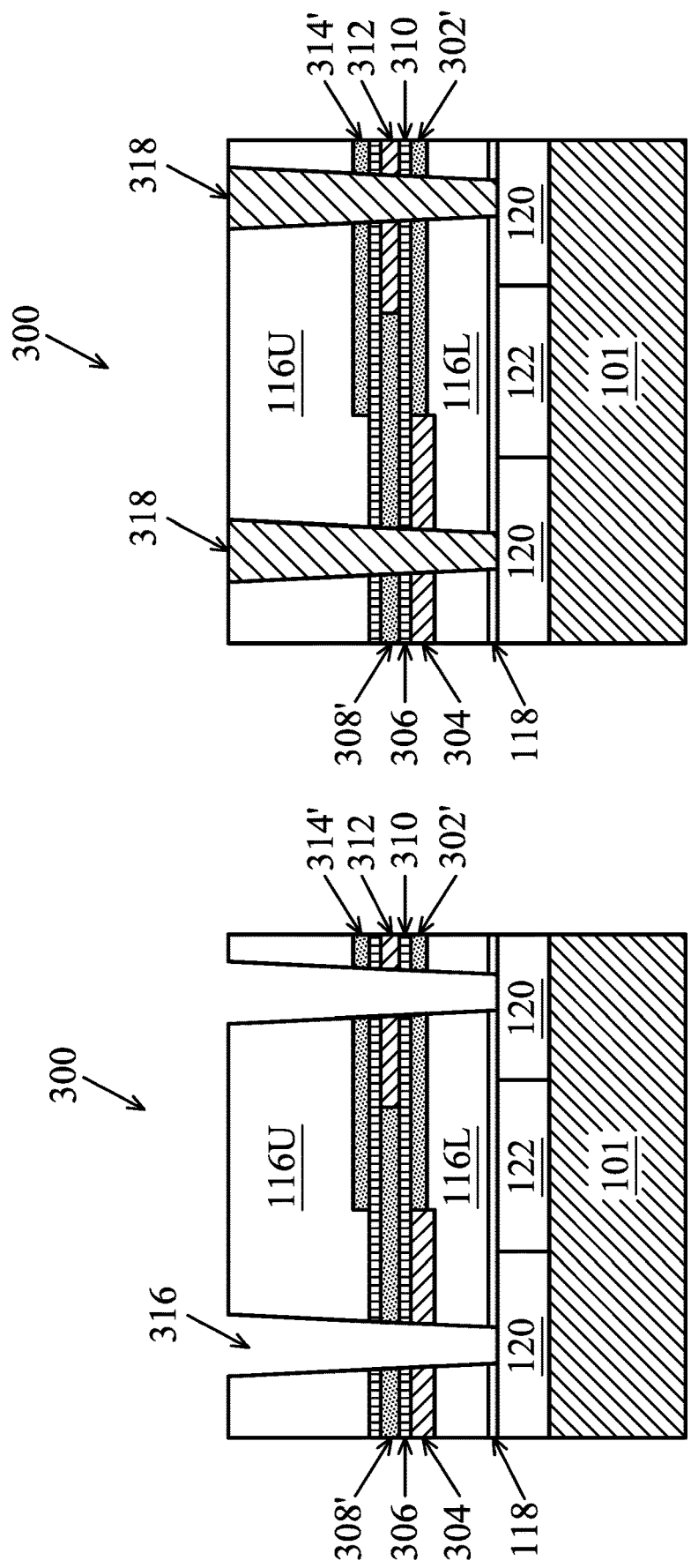

Exemplary of an embodiment of further processing includes but is not limited to features illustrated in exemplary FIG. 3K. An insulating layer 116U is deposited over the substrate 101 and the capacitor 300. The insulator layer 116U may be substantially similar to as discussed above with reference to FIG. 1 and the MIM capacitor 100. Contact holes 316 are formed through the insulator layer 116U, and underlying layers, to expose the top metal layer 120. The etching of the insulator layer 116U and/or underlying layer (s) may include a plasma-induced etching process(es). In an embodiment, the contact hole 316 is filled with conductive material to form a via 318 as illustrated in FIG. 3L. The via 318 may provide electrical contact to the top metal layer 120 (e.g., uppermost metal layer of a MLI) and the capacitor 300 as illustrated in FIG. 3L. The via 318 may be filled with copper, aluminum, AlCu, and/or other suitable materials.

It is noted that the MIM capacitor 300 has three plates as illustrated and described above. However, this configuration is exemplary only and not intended to be limiting beyond what is specifically recited in the claims that follow. A capacitor of additional plates or fewer plates (e.g., also including an oxide such as 304 and/or 310) may also be fabricated using the method 200 of FIG. 2. For example, in an embodiment, blocks 216 and 218 are omitted. In another example, portions of the block 214 is also omitted and an insulating layer such as layer 116U is formed over the electrode formed in block 212, which can provide an upper electrode of the capacitor.

As indicated above, the device 300 may be substantially similar to that of the device 100. Similarly, the thicknesses of layers 302, 308 and 314 and the thicknesses of layers 306 and 312 may be selected based on the desired performance of the capacitor. The thickness of the dielectric layers 306 and 312 may be determined as desired to tune the capacitance of the MIM capacitor 300. Exemplary thicknesses for the dielectric layers 306 and/or 312 include approximately 20 Angstroms to approximately 100 Angstroms. In an embodiment, the dielectric layers 306 and 312 are each approximately 60 Angstroms. In an embodiment, the dielectric layers 306 and 312 may have a thickness different than one another. The thickness of the dielectric layers 306 and/or 312 may be based on a trade-off between capacitor performance and dielectric layer reliability determined for the given device. The capacitor performance may be increased by a reduced thickness of layers 306 and/or 312, but the reduced thickness may raise a risk of reliability concerns, for example, from dielectric material breakdown of layers 306 and/or 312.

The electrodes 302, 308, and 314 may be similar to those of 102, 104, and 106 discussed above. The thickness of the electrodes 302, 308, and 314 may be determined to ensure adequate conductive properties of the plate(s). Exemplary thicknesses include between approximately 400 Angstroms and approximately 800 Angstroms. In a further embodiment, the thickness of each electrode is between approximately 400 and approximately 600 Angstroms. In an embodiment, any of electrodes 302, 308, and 314 may have thicknesses that are different from one or more of the other electrodes 302, 308, and 314. The thickness of the electrode 302, 308, and/or 314 may be increased to provide for increased speed in charging the associated capacitor. In an embodiment, the thickness of any one of electrodes 302, 308, and 314 from another of the electrodes 302, 308, and 314 and an alternating current (AC) is provided to one or more of the electrodes 302, 308, and 314.

Thus, provided in the present disclosure are methods and devices that provide among other features a dielectric layer that is adjacent an electrode of a capacitor. The dielectric layer may be differently comprised that the insulating layer formed between plates of the capacitor. In some embodiments, the dielectric layer adjacent the electrode of the capacitor functions to provide protection to a weak corner or edge region of the capacitor plate. In some embodiments, using MIM capacitor 300 as exemplary, the oxide layers 304 and 310 do not provide the permittivity that determines the capacitor performance. Rather, the permittivity that determines the capacitor performance is provided by dielectric layers 306 and 312.

The present disclosure provides various embodiments of methods to fabricate a metal-insulator-metal (MIM) capacitor. In one of the broader embodiments, a method includes forming a bottom electrode, forming a first oxide layer adjacent the bottom electrode, and depositing a first high-k dielectric layer over the bottom electrode and the first oxide layer. A middle electrode is then formed over the first high-k dielectric layer and a second oxide layer is formed adjacent the middle electrode. A second high-k dielectric layer may be deposited over the middle electrode and the second oxide layer and a top electrode over the second high-k dielectric layer.

In a further embodiment, the method also includes providing a top metal layer and an inter-metal dielectric (IMD) and forming an insulator layer over the top metal layer and the IMD; and wherein the bottom electrode is formed over the insulator layer. In an embodiment, the method step of forming the first oxide layer includes depositing an oxide material and performing a chemical mechanical planarization (CMP) process on the oxide material. The CMP process may provide a planar surface comprising the oxide material and the bottom electrode. In an embodiment, the first high-k dielectric layer is deposited directly on this planar surface. In an embodiment, the forming the middle electrode over the first high-k dielectric layer includes depositing a conductive material as a conformal layer, patterning the conformal layer to form an opening in the conductive material, depositing the second oxide layer in the opening, and performing a chemical mechanical planarization (CMP) process on the second oxide layer and the conductive material. In a further embodiment, this CMP process forms a planar surface of the second oxide layer and the conductive material; and wherein the depositing the second high-k dielectric layer forms the second high-k dielectric layer directly on the planar surface. In an embodiment of the method discussed above, forming the first oxide layer includes chemical vapor deposition of silicon oxide.

In another of the broader embodiments, a method of fabricating a metal-insulator-metal (MIM) capacitor structure on a substrate includes forming a first conductive material layer over a substrate and patterning the first conductive material layer to form a first electrode and an opening. An oxide material is deposited in the opening. A chemical mechanical polishing (CMP) process is performed on the first electrode and deposited oxide material to form a planar surface. A high-k dielectric material having a different composition than the oxide material is deposited on the planar surface and a second electrode is formed over the high-k dielectric material.

In a further embodiment of the method, the first conductive material layer is titanium nitride. In an embodiment, wherein the planar surface discussed above includes a first portion defined by the first electrode and a second portion defined by the deposited oxide material. The high-k dielectric material may be deposited directly on the first portion and the second portion.

In a further embodiment of the broader method discussed above, the oxide material is approximately twice a thickness of the first electrode. In an embodiment, forming the second electrode includes depositing a second conductive material layer and patterning the second conductive material to form the second electrode and another opening. This method may include filling the another opening with another oxide material and planarizing the another oxide material. In an embodiment, the method further includes forming a third electrode over the another oxide material.

Yet in another embodiment, a metal-insulator-metal (MIM) capacitor structure is provided. The MIM capacitor structure includes a bottom electrode formed over a substrate and a first oxide layer coplanar with the bottom electrode. The structure has a first high-k dielectric layer on the first oxide layer and the bottom electrode and a middle electrode over the first high-k dielectric layer. A second oxide layer is coplanar with the middle electrode. The structure includes a second high-k dielectric layer over the second oxide layer and the middle electrode and a top electrode over the second high-k dielectric layer.

In an embodiment of the MIM capacitor structure, the first oxide layer has a top surface substantially coplanar with a top surface of the bottom electrode. The first high-k dielectric layer may be disposed directly on the top surface of the first oxide layer and the top surface of the bottom electrode.

In an embodiment, the MIM capacitor structure further includes a top metal layer of a multi-layer interconnect under the bottom electrode.

The foregoing has outlined features of several embodiments so that those skilled in the art may better understand the detailed description. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a top metal layer and an inter-metal dielectric (IMD);
   forming a first silicon oxide layer adjacent a bottom electrode, wherein the forming the first silicon oxide layer includes: forming an opening in a conductive material to provide the bottom electrode, wherein the forming the opening includes etching the conductive material and a portion of the IMD, and chemical vapor deposition of silicon oxide into the opening;
   depositing a first high-k dielectric layer over the bottom electrode and the first silicon oxide layer;
   forming a middle electrode over the first high-k dielectric layer;
   forming a second silicon oxide layer adjacent the middle electrode;
   depositing a second high-k dielectric layer over the middle electrode and the second silicon oxide layer; and
   forming a top electrode over the second high-k dielectric layer.

2. The method of claim 1, further comprising:
   forming an insulator layer over the top metal layer and the IMD; and wherein the bottom electrode is formed over the insulator layer.

3. The method of claim 1, wherein the forming the first silicon oxide layer includes:
   depositing a silicon oxide material; and
   performing a chemical mechanical planarization (CMP) process.

4. The method of claim 3, wherein the CMP process provides a planar surface comprising the silicon oxide material and the bottom electrode.

5. The method of claim 4, wherein the depositing the first high-k dielectric layer over the bottom electrode and the first silicon oxide layer includes depositing the first high-k dielectric layer directly on the planar surface.

6. The method of claim 1, wherein the forming the middle electrode over the first high-k dielectric layer includes:
   depositing a conductive material as a conformal layer;
   patterning the conformal layer to form an opening in the conductive material;
   depositing the second silicon oxide layer in the opening; and
   performing a chemical mechanical planarization (CMP) process on the second silicon oxide layer and the conductive material.

7. The method of claim 6, wherein the performing the CMP process forms a planar surface of the second silicon oxide layer and the conductive material; and wherein the depositing the second high-k dielectric layer forms the second high-k dielectric layer directly on the planar surface.

8. The method of claim 1, wherein the forming the first silicon oxide layer includes forming a substantially planar surface of
   silicon oxide in the opening and the bottom electrode.

9. A method of fabricating a metal-insulator-metal (MIM) capacitor, the method comprising:
   forming a first conductive material layer over a substrate;
   patterning the first conductive material layer to form a first electrode and an opening;
   depositing an oxide material in the opening;
   performing a chemical mechanical polishing (CMP) process on the first electrode and deposited oxide material to form a planar surface, wherein after the CMP process the oxide material has a second thickness and the first electrode has a first thickness, the second thickness greater than the first thickness;
   depositing a high-k dielectric material having a different composition than the oxide material on the planar surface; and
   forming a second electrode over the high-k dielectric material.

10. The method of claim 9, wherein the first conductive material layer is titanium nitride.

11. The method of claim 9, wherein the planar surface includes a first portion defined by the first electrode and a second portion defined by the deposited oxide material.

12. The method of claim 11, wherein the high-k dielectric material is deposited directly on the first portion and the second portion.

13. The method of claim 9, wherein the deposited oxide material is approximately twice a thickness of the first electrode.

14. The method of claim 9, wherein the forming the second electrode includes depositing a second conductive material layer and patterning the second conductive material layer to form the second electrode and another opening.

15. The method of claim 14, further comprising:
   filling the another opening with another oxide material; and
   planarizing the another oxide material.

16. The method of claim 15, further comprising:
   forming a third electrode over the another oxide material.

17. A method of fabricating a metal-insulator-metal (MIM) capacitor structure, comprising:
   providing a first silicon oxide layer adjacent and coplanar a bottom electrode formed over a substrate, wherein a bottom surface of the first silicon oxide layer is closer to the substrate than a bottom surface of the bottom electrode;
   depositing a first high-k dielectric layer on the first silicon oxide layer and the bottom electrode;
   forming a middle electrode over the first high-k dielectric layer;
   forming a second oxide layer adjacent to and coplanar with the middle electrode;
   depositing a second high-k dielectric layer over the second oxide layer and the middle electrode; and
   forming a top electrode over the second high-k dielectric layer.

18. The method of claim 17, wherein the first silicon oxide layer has a top surface substantially coplanar with a top surface of the bottom electrode.

19. The method of claim 17, wherein the depositing the first high-k dielectric layer deposits material of the first high-k dielectric layer directly on the top surface of the first silicon oxide layer and the top surface of the bottom electrode.

20. The method of claim 17, further comprising:
forming a top metal layer of a multi-layer interconnect prior to forming the bottom electrode.

* * * * *